United States Patent [19]

Casto et al.

[11] Patent Number: 5,060,052
[45] Date of Patent: Oct. 22, 1991

[54] TAB BONDED SEMICONDUCTOR DEVICE HAVING OFF-CHIP POWER AND GROUND DISTRIBUTION

[75] Inventors: James J. Casto; Charles G. Bigler, both of Austin, Tex.

[73] Assignee: Motorola, Inc., Schaumburg, Ill.

[21] Appl. No.: 577,234

[22] Filed: Sep. 4, 1990

[51] Int. Cl.$^5$ .............. H01L 23/02; H01L 23/12; H01L 39/02; H01L 29/44
[52] U.S. Cl. ..................................... 357/74; 357/69; 357/70; 357/80; 361/393; 361/404
[58] Field of Search ................ 357/69, 70, 74, 80; 361/393, 403, 404

[56] References Cited

U.S. PATENT DOCUMENTS

| | | | |
|---|---|---|---|
| 4,209,355 | 6/1980 | Burns | 156/630 |
| 4,631,820 | 12/1986 | Harada et al. | 29/840 |
| 4,701,781 | 10/1987 | Sankhagowit | 357/70 |
| 4,731,700 | 3/1988 | Woodward et al. | 361/388 |
| 4,912,547 | 3/1990 | Bilowith et al. | 357/80 |
| 4,937,656 | 6/1990 | Kohara | 357/70 |

Primary Examiner—Rolf Hille
Assistant Examiner—David Ostrowski
Attorney, Agent, or Firm—Jasper W. Dockrey

[57] ABSTRACT

In a TAB bonded semiconductor device, off-chip power and ground distribution is provided by electrically conductive leads spanning across the face of the semiconductor device. Means for supporting at least one TAB lead carrying a power or ground signal across the face of the semiconductor device to an external bonding site is positioned in a central portion of the chip bonding area. In accordance with one embodiment of the invention, a semiconductor device is provided having a plurality of bonding pads arrayed on at least two sides of a face surface thereon. At least one TAB lead is bonded to a bonding pad on a first side of the face surface and spans across the face surface and is bonded to a bonding pad located in a second side of the face surface. An interior tape section overlies a central portion of the face surface supporting the TAB lead.

4 Claims, 5 Drawing Sheets

TAB BONDED SEMICONDUCTOR DEVICE HAVING OFF-CHIP POWER AND GROUND DISTRIBUTION

BACKGROUND OF THE INVENTION

This invention relates in general to a tape-automated-bonding (TAB) bonded semiconductor device, and more particularly to a TAB bonded semiconductor device having off-chip power and ground distribution.

Today's VLSI devices integrate a large number of functions in a single integrated circuit chip. As the integration level has increased, the circuit network and the required signal transmission rate through that network have increased as well. In order to achieve a high signal transmission rate, circuit designers have attempted to avoid the use of long power and ground busses within the chip and have instead provided output drivers and receivers in close proximity to external contact sites or bonding pads on the surface of the chip. Using this design method often requires that package interconnection circuitry and input-output (I/O) pins be provided for power and ground connection at many different locations around the chip. The introduction of extra I/O pins increases the amount of space necessary to mount the packaged device on a mounting substrate such as a printed-circuit-board (PCB). One solution is to interconnect the contact pads within the chip itself; however, the interconnection of output drivers and receivers through power and ground busses within the device consumes valuable space and results in high inductance transmission lines.

Another potential solution is to use a conventional leadframe for off-chip signal transmission and wire bond one or more bonding pads to a single outer lead in the leadframe. Several wire bonded designs have been developed, see for example, U.S. Pat. No. 4,937,656 to M. Kohara. However, conventional wire bonding cannot meet the bonding pad pitch spacing requirements of many VLSI devices. A preferred method for bonding tightly spaced bonding pads on a VLSI device to external package circuitry is TAB bonding.

Various TAB tape designs have been developed to address the inner lead bonding requirements of different package types. Shown in FIG. 1, in plane view, is a section of a copper leaded two-layer TAB tape 10 formed in accordance with the prior art. TAB Tape 10 includes a punched polymer tape 12 supporting a patterned copper metal layer having a thickness of about 20 to 40 microns. The copper metal layer is laminated to polymer tape 12 and photolithographically patterned and etched to form a series of individual copper leads 14. Sections of polymer tape 12 are punched out to permit the proximal ends of leads 14 to be bonded to a semiconductor device (not shown) and to permit the distal ends to be forged into a shape suitable for connection to outer leads, such as those provided by a conventional leadframe, or bonded directly to a substrate such as a PCB. The TAB tape shown in FIG. 1 is configured for inner lead bonding to a semiconductor device having peripheral bonding pads arrayed on all sides of the face surface of the device. Upon bonding and encasement in an insulating package body, a packaged device such as a quad-flat-package (QFP) is formed. Other four sided and two sided inner lead bonding configurations provided in a TAB format are well known in the art and include, for example, dual-in-line (DIP) and small-outline-J-lead (SOJ) type packages.

Selected ones of leads 14 are designated to provide external signal paths for ground and power distribution networks within the semiconductor device. A TAB bonded semiconductor device using the TAB tape shown in FIG. 1, must have circuit networks within the semiconductor device itself in order to facilitate the delivery of ground and power signals across the semiconductor device to selected external leads 14. Thus there remains a need for a packaged semiconductor device in a TAB format having low inductance off-chip power and ground distribution bussing.

BRIEF SUMMARY OF THE INVENTION

In practicing the present invention there is provided a TAB bonded semiconductor device in which a TAB tape having one or more selected inner leads, supported by an interior section of the tape, span the center opening in the tape. The selected inner leads bond to predetermined bonding pads arrayed on the face of the semiconductor device to provide off-chip power and ground signal distribution. In accordance with one embodiment of the invention, a semiconductor device is provided having a plurality of bonding pads arrayed on at least two sides of a face surface thereon. At least one TAB lead is bonded to a bonding pad on a first side of the face surface and spans across the face surface and is bonded to a bonding pad located on a second side of the face surface. An interior tape section overlies a central portion of the face surface supporting the at least one TAB lead.

Figure 1:
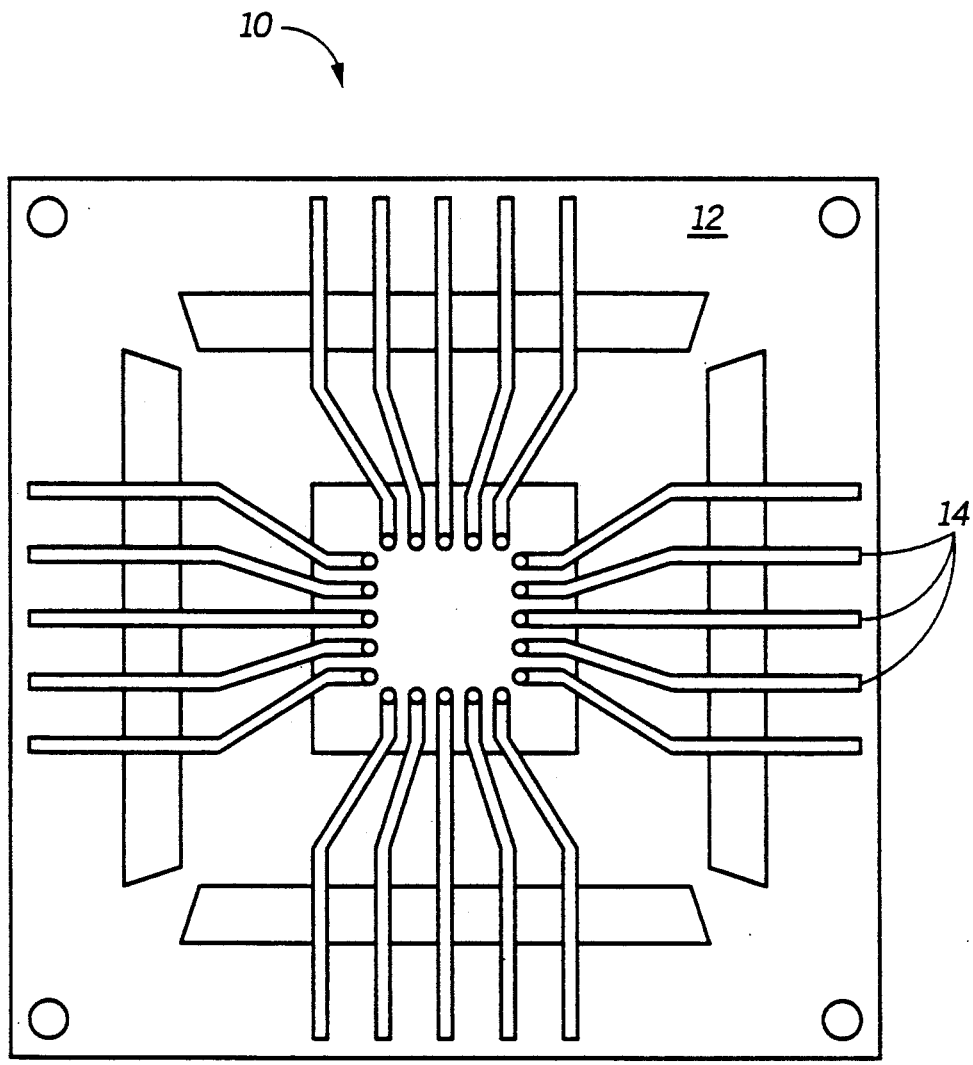
FIG. 1 illustrates, in plan view, a TAB tape formed in accordance with the prior art.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE PREFERRED EMBODIMENTS

Figure 2:
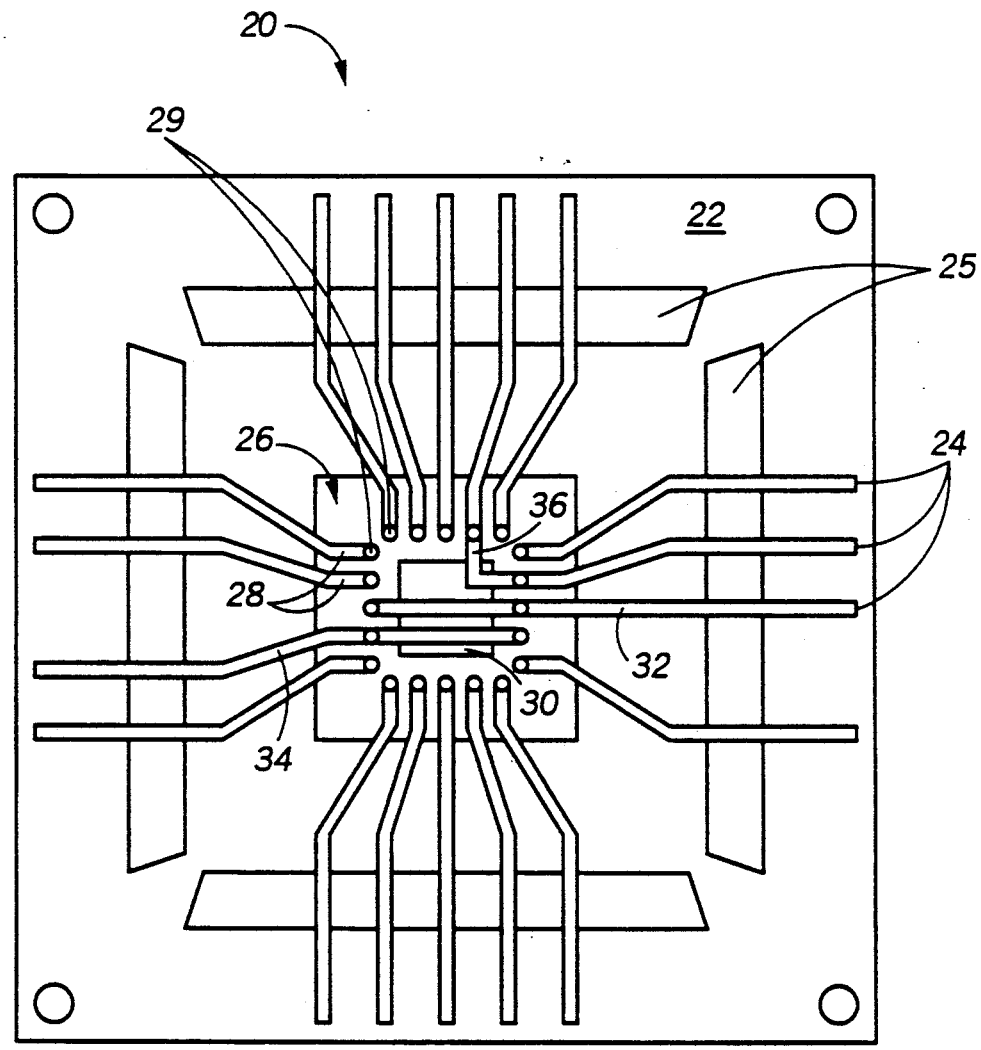
FIG. 2 illustrates, in plan view, a TAB tape formed in accordance with the invention.

Various aspects of the invention will now be described in detail with reference to the FIGURES. Illustrated in FIG. 2 is a sectioned, two-layer TAB tape 20, configured in accordance with one embodiment of the invention, viewed from the side upon which a semiconductor device (not shown) is attached. TAB tape 20 is comprised of a two-layer composite structure, laminated together in a known manner, which includes a sectioned carrier film 22 supporting a plurality of patterned metal leads 24. Portions of carrier film 22 have been excised to form lead bonding windows 25 and a center opening 26. Carrier film 22 is fabricated from a flexible polymer such as polyimide, polyester, polyparabanic acid, and the like. Leads 24 are preferably formed from copper, gold, copper plated with gold and tin, and the like. Alternatively, leads 24 can be formed from copper plated with a lead/tin solder. A thin layer of copper or chromium can also be present to promote adhesion of the lead forming metal to carrier film 22. It is to be understood that other tape strata combinations are possible and are considered within the scope of the present invention. Leads 24 have proximal ends 28 which extend into opening 26. Each of proximal ends 28 terminate at bonding ends 29 which are configured for attachment to a plurality of bonding pads located on the face of the semiconductor device. Center opening 26 provides an area free from carrier tape 22 where proximal ends 28 can be aligned to a plurality of bonding pads arrayed on the face of the semiconductor device and electrically coupled by a bonding tool.

An interior tape section 30 supports selected ones of leads 24 that span center opening 26. As shown in FIG. 2, interior tape section 30 can support a variety of lead configurations. For example, the selected leads can span a portion of center opening 26 and terminate on an opposite side of interior tape section 30. Two such leads 32 and 34 are depicted in FIG. 2. Alternatively, the selected leads can span a portion of center opening 26 forming a single continuous lead originating on one side of center opening 26 and continuing to a different side of center opening 26. One example of this type of lead configuration is illustrated in FIG. 2 where a continuous lead 36 has an elbow portion supported by interior tape section 30. It should be apparent that interior tape section 30 is capable of providing support for a large variety of lead configurations and that only a few representative configurations are illustrated in FIG. 2. As will subsequently be described, the ability to support selected leads, spanning center opening 26, enables off-chip power and ground distribution to be performed in the package circuitry.

Figure 3:
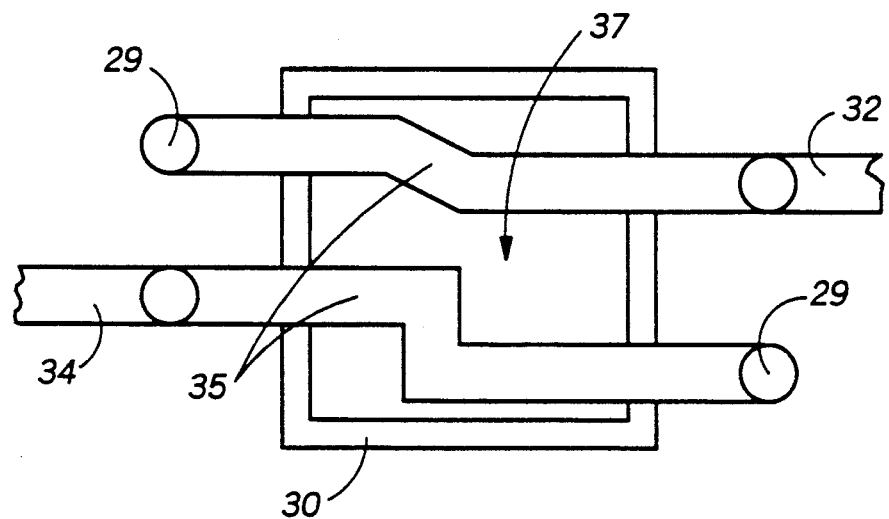
FIG. 3 shows a portion of the TAB tape illustrated in FIG. 2 having an alternative lead configuration.

An important consideration in the TAB bonding process is to provide a means of relief of tensile or compressive forces in the TAB leads that can develop during operation of the semiconductor device. During operation a considerable amount of heat can be generated by the semiconductor device which then dissipates through the package increasing the temperature of the metal leads. When the device is subsequently turned off, the lead temperature diminishes eventually reaching approximately the temperature of the surrounding environment. When exposed to changing temperatures, differences in the thermal expansion rate between the metal leads and the semiconductor device itself can result in a tensile or compressive force within the leads sufficient to break the bonds between the leads and the bonding pads. A certain amount of tensile and compression force can be tolerated by the leads; however, in packages where a considerable amount of expansion and contraction is likely to take place, the leads can be configured such that they will absorb a substantial amount of the thermally induced internal stress. An example of such a lead configuration is shown in FIG. 3.

Selected leads 32 and 34 have a jogged portion 35 that permits leads 32 and 34 to expand and contract in response to changes in ambient temperature. An opening 37 in interior tape section 30 gives the leads unrestrained freedom to expand and contract a specified amount as the surrounding temperate changes.

Figure 4:
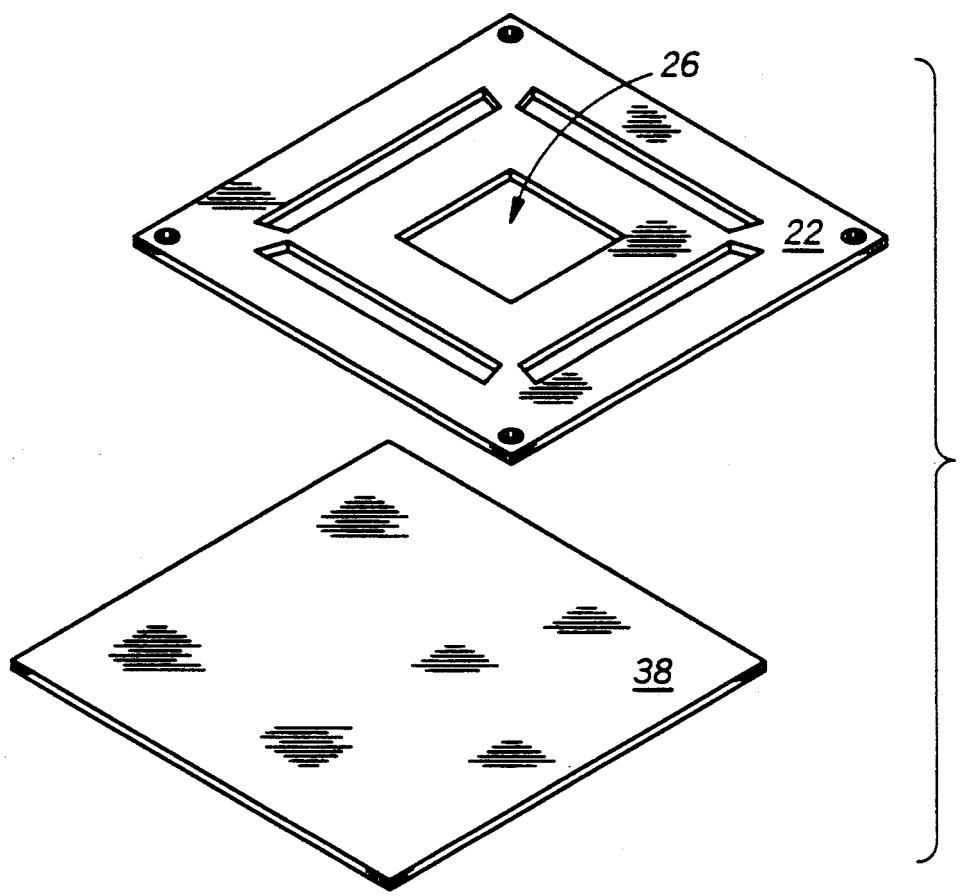
FIG. 4 is an exploded view of a composite two-layer tape assembly.
Figure 5:
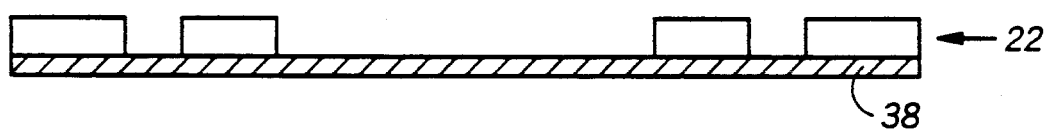
FIGS. 5 and 6 illustrate, in cross section, a laminated composite assembly in accordance with the invention.
Figure 6:
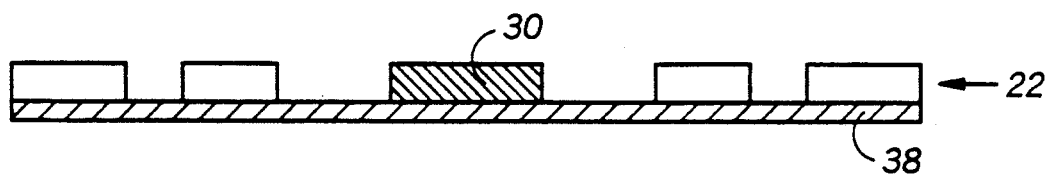

One embodiment of a tape assembly process used to form TAB tape 20 is shown in FIGS. 4–6. As illustrated in the exploded view of FIG. 4, carrier film 22, having already been punched to form openings for lead bonding, including center opening 26, is brought together and laminated to a copper foil 38. A cross sectional view of the laminated composite tape is shown in FIG. 5. A thin composite layer, comprised of metals such as chromium and copper (not shown), can be present at the interface between carrier film 22 and copper foil 38 to increase the adhesion of the copper foil to the tape. The adhesion promoting composite layer is deposited onto the surface of copper foil 38 by, for example, successive sputter deposition of copper and chromium thin films prior to the lamination step.

As shown in FIG. 6, after lamination of carrier film 22 to copper foil 38, interior tape section 30 is placed at a predetermined position on copper foil 38 within center opening 26 of carrier film 22 and laminated to copper foil 38. Alternatively, interior tape section 30 can be positioned on copper foil 38 prior to lamination and both carrier film 22 and interior tape section 30 laminated to copper foil 38 in the same operation. One skilled in the art will recognize that the lead support function provided by interior tape section 30 can be realized by placement of interior tape section 30 on either side of copper foil 38, and that a process can be used wherein interior tape section 30 is laminated on the side of copper foil 38 opposite that shown in FIG. 6.

After carrier film 22 and copper foil 38 have been laminated together, the individual leads are defined in the copper foil by a patterning and metal etching process. To form the leads, copper foil 38 is photolithographically patterned with a predetermined lead pattern. Then copper foil 38 is preferably etched in a conventional wet chemical etch to form individual leads and the resist pattern is removed. Alternatively, copper foil 38 can be etched in a plasma etching system or other "dry" etching apparatus.

Figure 7:
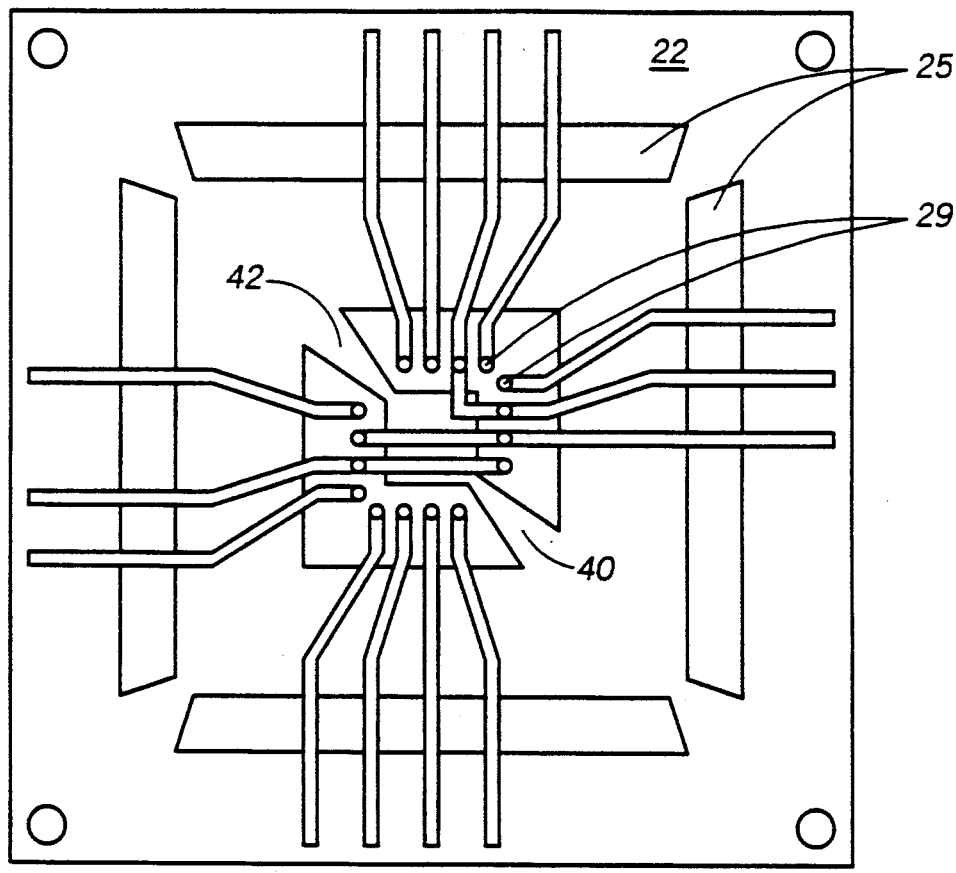
FIG. 7 illustrates, in plan view, a TAB tape formed in accordance with an alternative embodiment of the invention.

An alternative TAB tape design having an interior tape section in a one-piece format is illustrated in FIG. 7. In the alternative design, interior tape section 30 is supported by two tie bars 40 and 42. The tie bars flexibly attach interior tape section 30 to carrier film 22 and are formed in a single tape punching operation. The one-piece tape construction shown in FIG. 7 eliminates the need to perform extra placement and lamination steps during the formation of the TAB tape thereby simplifying the assembly process.

Figure 8:
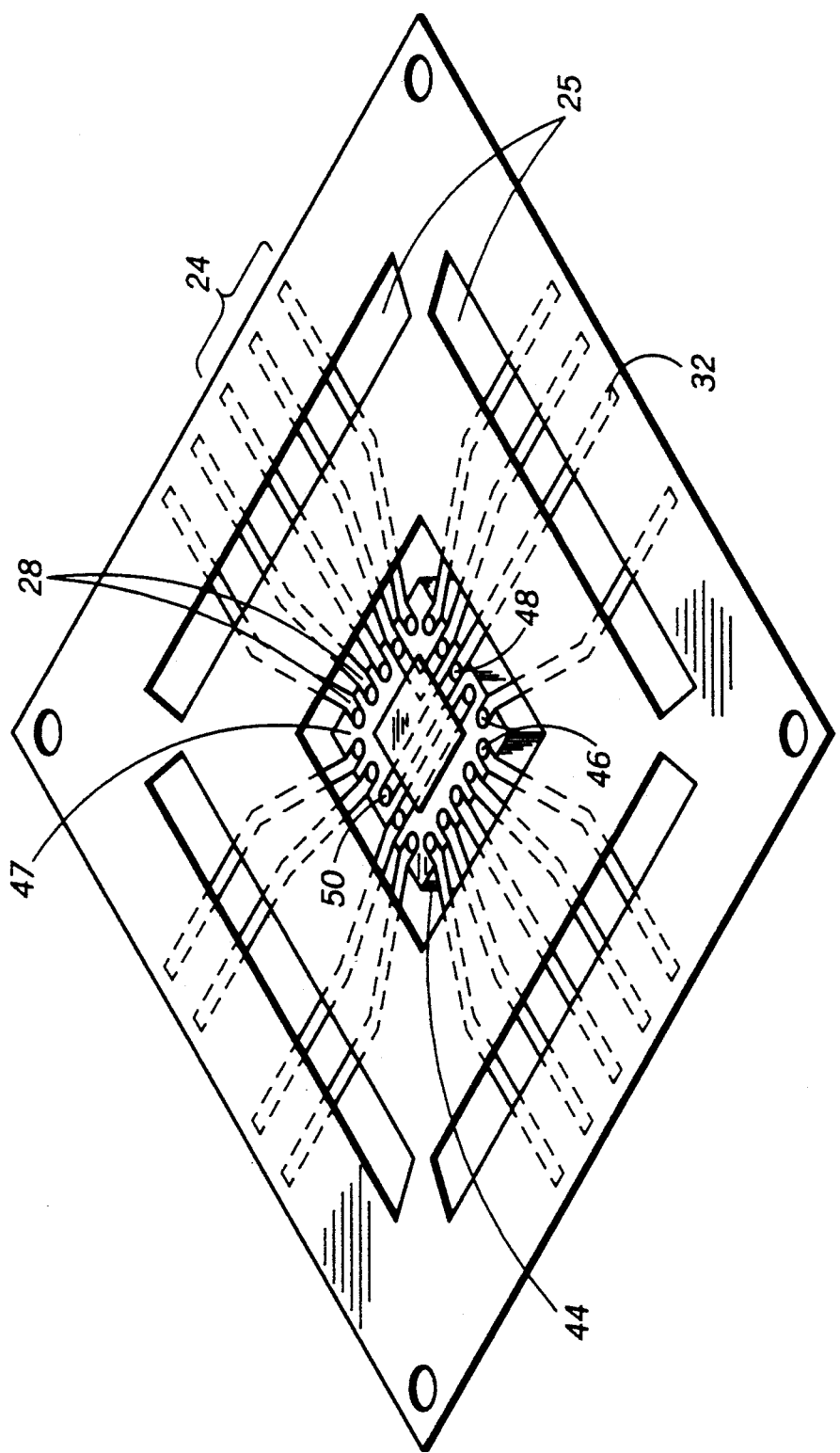
FIG. 8 is an isometric view of a TAB tape attached to a semiconductor device.

The TAB tape shown in FIGS. 2 and 7 can be used to provide off-chip power and ground signal distribution by bonding to a selected lead spanning across the face of the chip and bonding to a power or ground output on one or more sides of the chip. One example of a possible chip bonding arrangement is shown in FIG. 8. A semiconductor device 44, having a plurality of peripheral bond pads 46 arrayed on a face surface 47, is attached to the proximal ends 28 of leads 24 by means of a conventional TAB bonding process such as gold bumping. The gold bumps can be initially attached to either bonding pads 46 or alternatively, the gold bumps can be attached to bonding ends 29. Thermocompression bonding is then used to attach bonding ends 29 to bonding pads 46 wherein the gold bumps form a bond between the metal lead and the metal surface of the bonding pad. As shown in FIG. 8, lead 32 is bonded to a first bond pad 48 and extends across the face of semiconductor device 44 and is bonded to a second bond pad 50. Bond pads 48 and 50 are connected to individual output drivers within semiconductor device 44 and provide an output signal at bond pads 48 and 50. Lead 32 electrically connects bond pads 48 and 50 across the face of semiconductor device 44. A signal can therefore be provided by an output driver to bond pad 50 and be coupled to a signal provided at bond pad 48 without the construction of circuitry internal to semiconductor device 44. Interior tape section 30 supports lead 32 preventing the lead from sagging which can compromise the bonding process and result in a poor electrical connection. Further, sagging of the leads can cause the leads to be misaligned with the bonding pads on the face of semiconductor device 44. Additionally, interior tape section 30 holds lead 32, and other supported leads, in place preventing the leads from electrically shorting to one another. The across chip output capability provided by the present invention has the advantage of providing a low inductance signal line across the chip while removing the need to construct a costly and complex circuit network within the chip itself. Furthermore, the number of output pins in the package can be reduced or those pins that would be used for power and ground signals can be reassigned to data transmission or other functions. The structure shown in FIG. 8 can be further processed in one of several known process sequences to bond the distal ends of leads 24 to a second level of package interconnections, or alternatively, directly to a mounting substrate such as a PCB.

Figure 9:
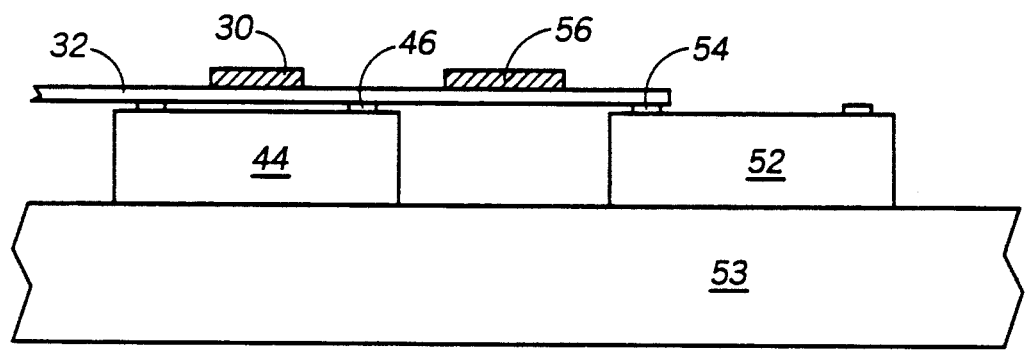
FIG. 9 illustrates, in cross section, a multi-chip TAB bonded package in accordance with an alternate embodiment of the invention.

In an alternative embodiment, lead 32 continues outwardly and bonds to bonding pads located on a second semiconductor device 52, shown in cross section, in FIG. 9. Both semiconductor devices 44 and 52 are mounted on a mounting substrate 53 which can be a conventional leadframe, a polyimide substrate having package leads patterned thereon, or a multi-layer ceramic substrate and the like. Lead 32 extends beyond bonding pads 46 on device 44 to bond to a bonding pad 54 located on the face of second semiconductor device 52 electrically coupling the two semiconductor devices. Lead 32 is supported by interior tape section 30 over the face surface of semiconductor device 44 and is further supported by a second tape section 56. The multi-chip tape is fabricated in a manner similar to the single chip tape fabrication process shown in FIGS. 4-6. The alternative embodiment illustrated in FIG. 9 can be used to provide off-chip ground and power distribution in a multi-chip TAB bonded package. For example, bonding pad 46 on semiconductor device 44 is electrically coupled to a power or ground output driver therein. A signal generated by the output driver in semiconductor device 44 is transmitted by lead 32 to a receiver in second semiconductor device 52 electrically coupled to bonding pad 54. Those skilled in the art will recognize that more than two semiconductor devices can be electrically coupled by the tape-supported TAB leads illustrated in FIG. 9. Additionally, more than one tape section can be used to support lead 32 electrically coupling the semiconductor devices.

Thus it is apparent that there has been provided, in accordance with the invention, a TAB bonded semiconductor device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the interior tape section can be formed by more than one piece of tape and can have a different geometry than that shown in the FIGURES such as concentric rectangular strips, two separate rectangular sections, and the like. Additionally, the leads spanning the center opening of the TAB tape can interconnect bonding pads having functions different from ground and power signal transmission, such as clock signals, data transmission, and the like. It is therefore intended to include within the invention all such variations and modifications as fall within the scope of the appended claims and equivalents thereof.

We claim:

1. A multi-chip TAB bonded package having off-chip power and ground distribution comprising:
   at least a first and second semiconductor device each having a plurality of bonding pads arrayed thereon;
   at least one selected bonding pad located on the first semiconductor device and at least one selected bonding pad on the second semiconductor device;
   at least one TAB lead bonded to the at least one selected bonding pad on each of the first and second semiconductor devices electrically coupling the first semiconductor device to the second semiconductor device; and
   a carrier tape supporting the at least one TAB lead intermediate to the first and second semiconductor devices.

2. The multi-chip TAB bonded package of claim 1 wherein the at least one selected bonding pad located on the first semiconductor device is electrically coupled to an output driver in the first semiconductor device and the at least one selected bonding pad on the second semiconductor device is electrically coupled to a receiver in the second semiconductor device.

3. The multi-chip TAB bonded package of claim 2 wherein the output driver in the first semiconductor device generates a power signal and receiver the in the second semiconductor device inputs the power signal.

4. The multi-chip TAB bonded package of claim 2 wherein the output driver in the first semiconductor device generates a ground signal and the receiver in the second semiconductor device inputs the ground signal.

* * * * *